United States Patent
Nakazawa et al.

(10) Patent No.: US 8,420,458 B2
(45) Date of Patent: Apr. 16, 2013

(54) SEMICONDUCTOR DEVICE AND METHOD OF PRODUCING SAME

(75) Inventors: Makoto Nakazawa, Osaka (JP); Mitsunobu Miyamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/260,886

(22) PCT Filed: Nov. 25, 2009

(86) PCT No.: PCT/JP2009/006368
§ 371 (c)(1), (2), (4) Date: Sep. 28, 2011

(87) PCT Pub. No.: WO2010/113229
PCT Pub. Date: Oct. 7, 2010

(65) Prior Publication Data
US 2012/0032263 A1    Feb. 9, 2012

(30) Foreign Application Priority Data
Apr. 3, 2009   (JP) ................................. 2009-090747

(51) Int. Cl.
*H01L 29/06*   (2006.01)
*H01L 21/20*   (2006.01)

(52) U.S. Cl.
USPC   438/149; 438/479; 257/E29.02; 257/E21.09; 257/E21.104; 257/E21.121; 257/E21.372; 257/E21.411; 257/E21.412; 257/E21.413; 257/E21.414; 257/E21.415; 257/E21.416

(58) Field of Classification Search ................... 438/149, 438/479; 257/E29.02, E21.09, E21.104, 257/257/E21.121, E21.372, E21.411, E21.412, 257/E21.413, E21.414, E21.415, E21.416
See application file for complete search history.

(56) References Cited

U.S. PATENT DOCUMENTS

| | | | | |
|---|---|---|---|---|
| 6,255,131 | B1* | 7/2001 | Mori et al. ..................... | 438/149 |
| 7,476,612 | B2* | 1/2009 | Kim .............................. | 438/637 |
| 7,872,722 | B2* | 1/2011 | Kimura ......................... | 349/141 |
| 8,115,188 | B2* | 2/2012 | Gosain et al. .................... | 257/4 |
| 2002/0135072 | A1* | 9/2002 | Han et al. ....................... | 257/774 |
| 2004/0051142 | A1* | 3/2004 | Yamazaki et al. ............. | 257/347 |
| 2007/0063283 | A1* | 3/2007 | Ohishi et al. .................. | 257/347 |
| 2007/0152217 | A1* | 7/2007 | Lai et al. ......................... | 257/59 |
| 2008/0093602 | A1* | 4/2008 | Matsumura et al. ............ | 257/71 |
| 2011/0241219 | A1* | 10/2011 | Nakazawa et al. ............. | 257/774 |

FOREIGN PATENT DOCUMENTS

| | | |
|---|---|---|
| JP | S61-222235 A | 10/1986 |
| JP | 4-83336 A | 3/1992 |
| JP | 4-280433 A | 10/1992 |
| JP | 2008-103609 A | 5/2008 |

OTHER PUBLICATIONS

International Search Report (ISR) issued in PCT/JP2009/006368 (International application) mailed in Mar. 2010 for Examiner consideration.

* cited by examiner

*Primary Examiner* — Wael Fahmy
*Assistant Examiner* — Hoan Nguyen
(74) *Attorney, Agent, or Firm* — Chen Yoshimura LLP

(57) ABSTRACT

A semiconductor device has a planarizing layer that is made of an inorganic film, and has a recessed portion formed in a region thereof in which a conductive film is disposed. A first contact hole penetrating through at least an interlayer insulating film is formed on a first wiring layer, while a second contact hole penetrating through at least the interlayer insulating film is formed on the conductive film so as to run through the inside of the recessed portion.

6 Claims, 9 Drawing Sheets

SEMICONDUCTOR DEVICE AND METHOD OF PRODUCING SAME

TECHNICAL FIELD

The present invention relates to a semiconductor device used for a liquid crystal display device and the like, for example, and a manufacturing method thereof.

BACKGROUND ART

A liquid crystal display device includes a TFT substrate having thereon a plurality of TFTs (thin-film transistors) and a plurality of pixel electrodes connected thereto arranged in a matrix, an opposite substrate placed opposite to the TFT substrate and having a color filter, a common electrode, and the like formed thereon, and a liquid crystal layer disposed between these opposite substrate and TFT substrate, for example.

Referring to FIG. 24, which is an enlarged cross-sectional view, a configuration of a TFT substrate 100 will be explained. On a glass substrate 101 constituting the TFT substrate 100, a lower layer gate electrode 102, a first base coat layer 103, a semiconductor layer 104, and a gate insulating film 105 are laminated. On the gate insulating film 105, an upper layer gate electrode 106 made of a metallic material is formed, and to cover the upper layer gate electrode 106, a second base coat layer 113 is formed thereover.

On the second base coat layer 113, a first interlayer insulating film 107 and a second interlayer insulating film 108 are laminated in this order. On the surface of the second interlayer insulating film 108, a lower layer gate wiring line 109, an upper layer gate wiring line 110, and a drain wiring line 111 are formed.

In recent years, development of a so-called system liquid crystal, in which a driver circuit and the like are directly incorporated in a glass substrate constituting a TFT substrate has been in progress in an effort to achieve higher functionality and higher integration of liquid crystal display devices. Further, the reduction of a frame region, which is a non-display region around a display region (also referred to as "frame narrowing") has also been pursued. However, as compared with a semiconductor layer and an insulating film, it is difficult to miniaturize wiring layers, such as gate electrodes and source wiring lines.

Consequently, as shown in FIG. 24, in a region in which the upper layer gate electrode 106 having a larger thickness is formed, the surface of the second interlayer insulating film 108 rises greatly, creating the surface unevenness. Therefore, when the upper layer gate wiring line 110 and the like are patterned by photolithography, the reduction of the accuracy thereof cannot be avoided, and a leakage fault or a wire breakage may be generated in the wiring layer. In a corner portion on the periphery of the raised portion of the second interlayer insulating film 108, for example, because it is difficult to completely remove an unnecessary wiring layer, a residue 112 may remain as shown in FIGS. 24 and 25. A leakage fault between wiring lines is induced by this residue 112. Here, FIG. 25 is a photo showing an enlarged view of the residue 112 formed on the second interlayer insulating film 108.

In this connection, forming a planarizing film on the interlayer insulating film, and then forming a wiring layer on the surface of the planarizing film can be considered. Patent Document 1 discloses performing a planarization of a planarizing film made of a resin and a formation of contact holes in the planarizing film at the same time.

FIG. 26 is a cross-sectional view showing a lamination structure in which a conventional photoresist film 136 is formed. FIG. 27 is a cross-sectional view showing a lamination structure in which a conventional contact hole 138 is formed.

As shown in FIG. 26, on the surface of a semiconductor substrate 131, an $SiO_2$ film 132 is formed. On the surface of the $SiO_2$ film 132, a wiring layer 133 and an oxide film 134 covering this wiring layer are formed. On the surface of the oxide film 134, a polyimide film 139 is laminated.

The oxide film 134 and the polyimide film 139 constitute a planarizing layer 140. By disposing the polyimide film 139 as an upper layer of the planarizing layer 140, the surface unevenness formed on the wiring layer 133 is smoothened.

Further, a photoresist film 136 is formed on the surface of the polyimide film 139. In the photoresist film 136, an opening 137 is formed above the wiring layer 133 by photolithography. Then, by performing etchback using the reactive-ion etching, removal of the photoresist film 136, planarization of the polyimide film 139, and formation of the contact hole 138 are simultaneously implemented as shown in FIG. 27.

After that, other wiring layers are formed on the surface of the polyimide film 139 and inside of the contact hole 138 to connect these other wiring layers to the wiring layer 133.

RELATED ART DOCUMENTS

Patent Documents

Patent Document 1: Japanese Patent Application Laid-Open Publication No. 1986-222235

SUMMARY OF THE INVENTION

Problems to be Solved by the Invention

However, the above-mentioned method of Patent Document 1 has a problem of not being able to perform a manufacturing process at relatively high temperature, because a resin material (polyimide resin) is used for the planarizing layer. Further, because a resin layer generates gas, such as moisture, the reduction of adhesion between the resin film and a wiring layer formed on the resin film cannot be avoided. Additionally, it is very difficult to miniaturize wiring layers laminated on the resin film by etching.

Also, when a planarizing film is formed on a surface of an interlayer insulating film formed in a step-shape above a wiring layer, the total film thickness of the interlayer insulating film and the planarizing film becomes relatively thin in a first region above the wiring layer, and becomes relatively thick in a second region around the first region. Therefore, in forming contact holes in the respective regions simultaneously, a contact hole in the first region is formed first and the wiring layer is exposed, which causes a problem of leaving the wiring layer being more likely to be damaged by etching during the formation of a contact hole in the second region. This problem becomes a serious problem in pursuing the efforts to miniaturize electrodes, wiring, and the like.

Further, as the efforts for miniaturization are pursued, the aspect ratio of the contact holes tends to be made higher. In a case where a conductive film is formed in the second region, however, the higher aspect ratio of the contact holes formed in the second region causes another problem of the conductive film that is exposed inside of the contact holes becoming more likely to be damaged by etching.

The present invention was made in view of the above-mentioned points, and the main objects of the present invention are to make possible a manufacturing process at relatively high temperature, and to suppress damage of a wiring layer and a conductive film in forming contact holes.

Means for Solving the Problems

To achieve the above-mentioned objects, a semiconductor device according to the present invention includes a conductive film formed on an insulating substrate; a first wiring layer formed on the insulating substrate, having a greater thickness than the conductive film; a planarizing layer disposed over the insulating substrate so as to cover the first wiring layer and the conductive film; and an interlayer insulating film disposed on the planarizing layer, wherein the planarizing layer is made of an inorganic film, and has a recessed portion formed in a region in which the conductive film is disposed, wherein a first contact hole penetrating through at least the interlayer insulating film and reaching the first wiring layer is formed on the first wiring layer, wherein a second contact hole penetrating through at least the interlayer insulating film and reaching the conductive film is formed on the conductive film so as to run through an inside of the recessed portion, and wherein, on the interlayer insulating film, a second wiring layer electrically connected to the conductive film through the second contact hole, and a third wiring layer electrically connected to the first wiring layer through the first contact hole are formed.

The conductive film may be a semiconductor layer with an impurity element introduced therein.

Further, an SiNx film that constitutes at least a part of the interlayer insulating film may be laminated on the surface of the planarizing layer.

The planarizing layer may be made of $SiO_2$.

Alternatively, the planarizing layer may be made of SiNx.

The first wiring layer may be a gate electrode of a thin-film transistor.

Also, a method of manufacturing a semiconductor device according to the present invention includes: forming a conductive film and a first wiring layer that is thicker than the conductive film on an insulating substrate; forming an inorganic film covering the first wiring layer and the conductive film over the insulating substrate; forming a photoresist film on a surface of the inorganic film; exposing the photoresist film to form a resist mask having an opening in a region in which the conductive film is formed; etching the resist mask and the inorganic film simultaneously to form a recessed portion in a surface of the inorganic film in a region that has been exposed by the opening, and to form a planarizing layer from the inorganic film by planarizing the surface of the inorganic film in a region that has been covered by the resist mask; forming an interlayer insulating film over the insulating substrate so as to cover the planarizing layer; forming, on the first wiring layer, a first contact hole penetrating through at least the interlayer insulating film and reaching the first wiring layer; forming, on the conductive film, a second contact hole penetrating through at least the interlayer insulating film and reaching the conductive film so as to run through an inside of the recessed portion; and forming, on the interlayer insulating film, a second wiring layer electrically connected to the conductive film through the second contact hole, and a third wiring layer electrically connected to the first wiring layer through the first contact hole.

The conductive film may be a semiconductor layer with an impurity element introduced therein.

Further, an SiNx film may be laminated on the surface of the planarizing layer in the step of forming the interlayer insulating film.

The planarizing layer may be made of $SiO_2$.

Alternatively, the planarizing layer may be made of SiNx.

The first wiring layer may be a gate electrode of a thin-film transistor.

—Features—

Next, features of the present invention will be explained.

In the above-mentioned semiconductor device, the planarizing layer covering a first wiring layer is made of an inorganic film, not a resin film. Therefore, it can be manufactured by a manufacturing process at a relatively high temperature, and also undesired gas is not generated from the planarizing layer. Thus, reliability of the device can be improved.

Further, because the recessed portion is formed on the surface of the planarizing layer in the region in which the conductive film is formed, the aspect ratio of a second contact hole that is formed inside of the recessed portion on the conductive film can be reduced. Therefore, in forming the second contact hole, damage received by the conductive film exposed inside thereof can be greatly reduced. Further, because the aspect ratio of the second contact hole formed at this time is reduced, damage received by the first wiring layer exposed inside of the first contact hole formed simultaneously with the second contact hole can be greatly reduced as well.

Thus, according to the semiconductor device, a manufacturing process at relatively high temperature can be made possible, and damage of the first wiring layer and the conductive film in forming the first contact hole and the second contact hole can be suitably suppressed.

Further, the second contact hole is constituted as a contact hole having a greater aspect ratio as a whole, coupled with a recess created on the surface of the interlayer insulating film by the recessed portion, therefore, the efforts for micronizing wiring layers can be further advanced.

In manufacturing the semiconductor device, first, a conductive film and a first wiring layer that is thicker than the conductive film are formed on an insulating substrate. Next, an inorganic film covering the first wiring layer and the conductive film is formed over the insulating substrate. After that, a photoresist film is formed on the surface of the inorganic film. Then, the photoresist film is exposed to form a resist mask that has an opening in the region in which the conductive film is formed.

Thereafter, the resist mask and the inorganic film are etched simultaneously. At this time, a recessed portion is formed on the surface of the inorganic film in the region that has been exposed from the opening, and at the same time, a planarizing layer is formed from the inorganic film by planarizing the surface of the inorganic film in the region that has been covered by the resist mask.

Thus, in the manufacturing method according to the present invention, because removal of the resist and formation of a planarizing film having the recessed portion are implemented simultaneously, the number of process steps can be reduced.

Next, an interlayer insulating film is formed on the insulating substrate so as to cover the planarizing layer. After that, a first contact hole penetrating through at least the interlayer insulating film and reaching the first wiring layer is formed on the first wiring layer, and a second contact hole penetrating through at least the interlayer insulating film and reaching the conductive film is formed on the conductive film so as to run through the inside of the recessed portion.

Next, a step is performed to form a second wiring layer electrically connected to the conductive film through the second contact hole, and a third wiring layer electrically connected to the first wiring layer through the first contact hole on the interlayer insulating film.

Here, the conductive film may be a semiconductor layer with an impurity element introduced therein, for example. In this case, by laminating a silicon nitride film on the surface of the planarizing layer before the interlayer insulating film is formed, even if the semiconductor layer is damaged in forming the recessed portion, hydrogen is supplied from the silicon nitride film laminated on the semiconductor layer, and the defect of the semiconductor layer can be repaired.

Effects of the Invention

According to the present invention, because the planarizing layer covering the first wiring layer and the conductive film is constituted of an inorganic film, the semiconductor device can be manufactured by a relatively high-temperature manufacturing process. Further, because the recessed portion is formed in the region in which a conductive film is disposed, and because a first contact hole is formed on the first wiring layer, and a second contact hole is formed on the conductive film so as to run through the inside of the recessed portion, the aspect ratio of the second contact hole can be reduced and damage to the conductive film and the first wiring layer can be suppressed. Furthermore, because the etching time can be reduced and over-etching can be suppressed, the second contact hole can be suitably miniaturized.

DETAILED DESCRIPTION OF EMBODIMENTS

Hereinafter, embodiments of the present invention will be explained in detail with reference to figures. The present invention, however, is not limited to such embodiments.

Embodiment 1

FIGS. 1 to 6 are showing an embodiment of the present invention.

Figure 1:
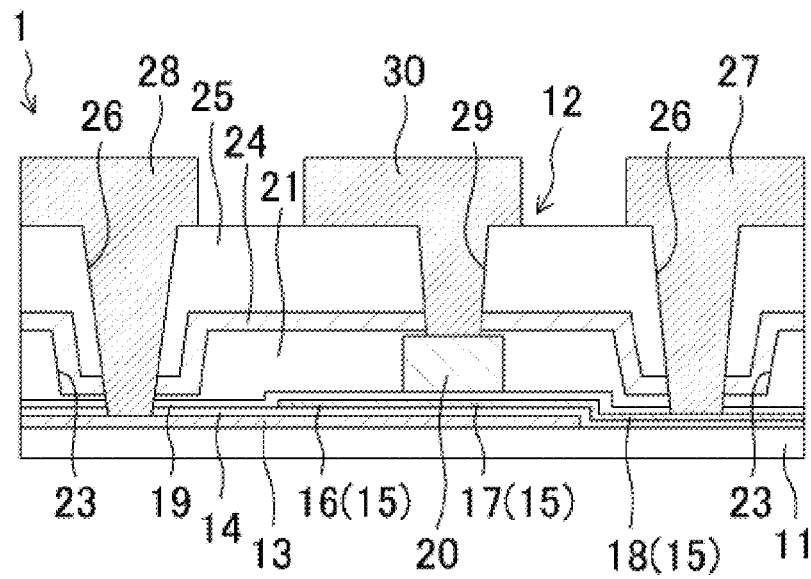
FIG. 1 is a cross-sectional diagram showing an enlarged view of a structure of a semiconductor device according to Embodiment 1.

FIG. 1 is a cross-sectional diagram showing an enlarged view of a structure of a semiconductor device 1 according to Embodiment 1. FIGS. 2 to 6 are cross-sectional views showing a manufacturing process of the semiconductor device 1 according to Embodiment 1.

(Configuration of Semiconductor Device)

The semiconductor device 1 is configured as a device including MOS transistors 12 formed on a glass substrate 11 as an insulating substrate. Although not shown in the figure, the semiconductor device 1 constitutes a display panel of a liquid crystal display device, for example.

Although not shown in the figure, the liquid crystal display device includes a TFT substrate having a plurality of TFTs (thin-film transistors) as switching elements formed therein, an opposite substrate placed opposite to the TFT substrate, and a liquid crystal layer disposed between these TFT substrate and opposite substrate. In the TFT substrate, a plurality of pixels are disposed, and each pixel has the TFT and a pixel electrode disposed therein. Also, on the TFT substrate, drivers that drive the plurality of pixels are formed in the non-display region thereof. The semiconductor device 1 in this embodiment constitutes this driver, for example.

On the surface of the glass substrate 11 of the semiconductor device 1, a lower layer gate electrode 13 is formed as a first conductive film. The lower layer gate electrode 13 is made of an Mo film, for example, and is formed in the thickness of about 100 nm, for example. The lower layer gate electrode 13 is thereby configured so as to function as a light-shielding film as well.

On the glass substrate 11, a bottom gate insulating film 14 is formed so as to cover the lower layer gate electrode 13. The bottom gate insulating film 14 is made of an $SiO_2$ film having a thickness of about 100 nm, for example. In addition, it is preferable to form a base coat layer made of SiNO in the thickness of about 50 nm, for example.

A semiconductor layer 15 made of silicon is formed over the glass substrate 11 in the thickness of about 50 nm so as to cover the bottom gate insulating film 14. The semiconductor layer 15 is constituted of a channel region 17, a source region 16, and a drain region 18, which is a second conductive film. While a part of the drain region 18 overlaps the lower layer gate electrode 13, the other parts of the drain region 18 do not overlap the lower layer gate electrode 13. On the other hand, the channel region 17 and the source region 16 overlap the lower layer gate electrode 13. The drain region 18 and the source region 16 are constituted by introducing an impurity element, such as boron, for example, to the semiconductor layer.

Also, on the bottom gate insulating film 14, a gate insulating film 19 is formed so as to cover the semiconductor layer 15. The gate insulating film 19 is made of $SiO_2$, for example, and is formed in the thickness of about 80 nm.

On the surface of the gate insulating film 19, a gate electrode 20 as a first wiring layer is formed, and placed to face the channel region 17 of the semiconductor layer 15. The gate electrode 20 as well as the semiconductor layer 15 and the lower layer gate electrode 13 constitute the MOS transistor 12. This gate electrode 20 is formed to be thicker than the lower layer gate electrode 13 and the semiconductor layer 15 (drain region 18), and is constituted by laminating TaN of about 50 nm and W of about 400 nm thickness with each other, for example.

Further, on the gate insulating film 19, a planarizing layer 21 is formed so as to cover the gate electrode 20, the semiconductor layer 15, and the like. The planarizing layer 21 is made of an inorganic film. The planarizing layer 21 can be made of an $SiO_2$ film, for example, and can be formed in the thickness of about 300 nm to 500 nm, for example.

The surface of this planarizing layer 21 is formed with recesses and protrusions, and is formed such that the surface becomes flat and also highest above the glass substrate 11 in the vicinity of a region in which the gate electrode 20 is formed.

Meanwhile, the planarizing layer 21 has recessed portions 23 respectively formed in regions that are lateral to the gate electrode 20 in which the lower layer gate electrode 13 and the drain region 18 are respectively disposed. The bottom portions of the recessed portions 23 are formed in the planarizing layer 21.

The recessed portions 23 may be formed so as to penetrate through the planarizing layer 21, but from a perspective of reducing etching damage to films formed on the glass substrate 11 side of the planarizing layer 21 (the lower layer gate electrode 13, the drain region 18 of the semiconductor layer 15, and the like), it is preferable that the bottom portions be formed in the planarizing layer 21.

On the planarizing layer 21, a first interlayer insulating film 24 and a second interlayer insulating film 25 are disposed. First, on the surface of the planarizing layer 21, the first interlayer insulating film 24 made of an inorganic film is laminated. The first interlayer insulating film 24 is made of a silicon nitride film (SiNx film), for example, and is formed with recesses and protrusions that follow a profile of the surface of the planarizing layer 21. That is, the inner surfaces of the recessed portions 23 are also covered by the first interlayer insulating film 24. It is preferable that the first interlayer insulating film 24 be formed in the thickness of about 50 nm to 250 nm, for example.

Further, on the surface of the first interlayer insulating film 24, the second interlayer insulating film 25 is laminated. The second interlayer insulating film 25 is made of $SiO_2$, for example, and is formed in the thickness of about 700 nm. The surface of this second interlayer insulating film 25 is formed to be flat at least in regions in which the planarizing layer 21 and the gate electrode 20 are formed.

On the gate electrode 20, a first contact hole 29 penetrating through the first interlayer insulating film 24 and the second interlayer insulating film 25 and reaching the gate electrode 20 is formed. Meanwhile, on the lower layer gate electrode 13 and on the drain region 18, second contact holes 26 penetrating through the first interlayer insulating film 24, the second interlayer insulating film 25, the planarizing layer 21, and the gate insulating film 19 and reaching the lower layer gate electrode 13 and the drain region 18, respectively, are formed, so as to run through the inside of the recessed portions 23. That is, inside the recessed portion 23, the inner diameter of the second contact hole 26 is smaller than the inner diameter of the recessed portion 23.

The second contact hole 26 on the drain region 18 goes from the surface of the second interlayer insulating film 25 and reaches the surface of the drain region 18. The second contact hole 26 on the lower layer gate electrode 13, on the other hand, goes from the surface of the second interlayer insulating film 25 and reaches the surface of the lower layer gate electrode 13, further penetrating through the bottom gate insulating film 14.

The second interlayer insulating film 25 has a drain wiring line 27, which is one second wiring layer, a lower layer gate wiring line 28, which is the other second wiring layer, and an upper layer gate wiring line 30, which is a third wiring layer, formed thereon.

The drain wiring line 27 is electrically connected to the drain region 18 through the second contact hole 26. The lower layer gate wiring line 28 is electrically connected to the lower layer gate electrode 13 through the second contact hole 26. Also, the upper layer gate wiring line 30 is electrically connected to the gate electrode 20 through the first contact hole 29. The drain wiring line 27, the lower layer gate wiring line 28, and the upper layer gate wiring line 30 are formed of a metal layer including aluminum, for example.

In this manner, the upper layer gate wiring line 30, the drain wiring line 27, and the lower layer gate wiring line 28, which are a plurality of wiring layers formed in the semiconductor device 1, are respectively formed on the second interlayer insulating film 25 having a planarized surface.

Also, the lower layer gate electrode 13 is not electrically floating (floating state), but is configured such that the electric potential applied thereto becomes variable, for example. Alternatively, the lower layer gate electrode 13 may be connected to the upper layer gate wiring line 30 or the like such that the electric potential thereof is fixed.

—Manufacturing Method—

Next, a method of manufacturing the semiconductor device 1 will be explained with reference to FIGS. 1 to 6.

Figure 2:
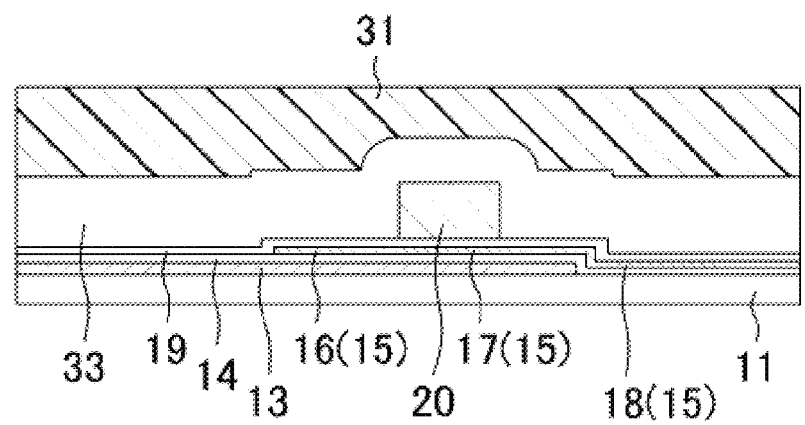
FIG. 2 is a cross-sectional view showing a photoresist film formed on an inorganic film.
Figure 3:
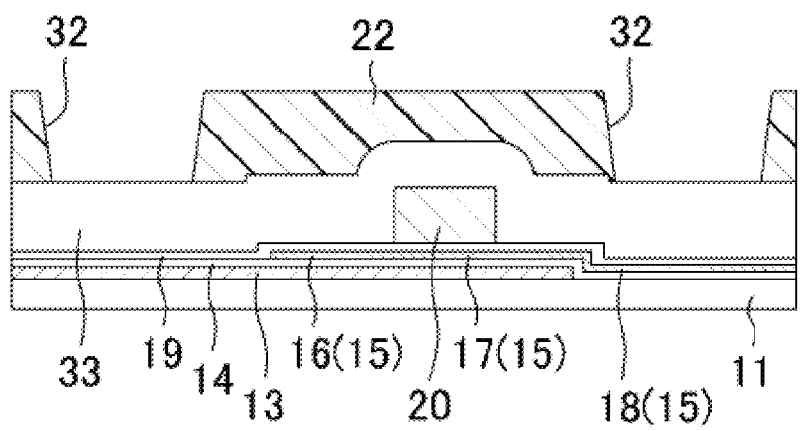
FIG. 3 is a cross-sectional view showing a resist mask with openings formed therein.
Figure 4:
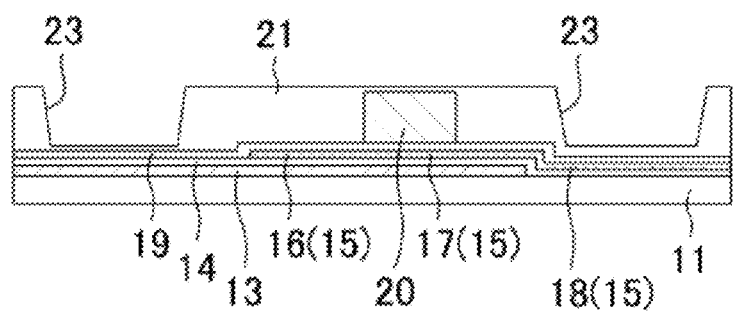
FIG. 4 is a cross-sectional view showing a planarizing layer with recessed portions formed therein.
Figure 5:
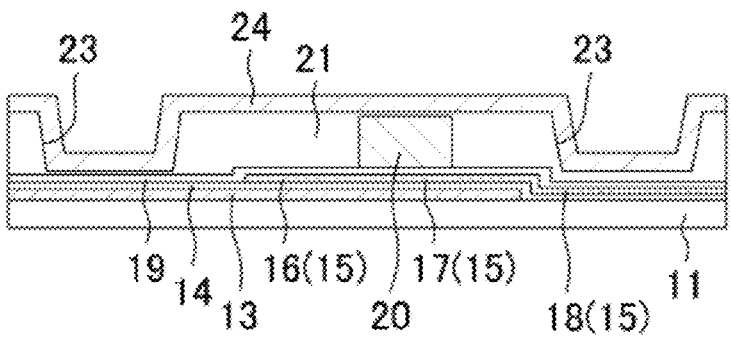
FIG. 5 is a cross-sectional view showing a first interlayer insulating film laminated on the planarizing layer.
Figure 6:
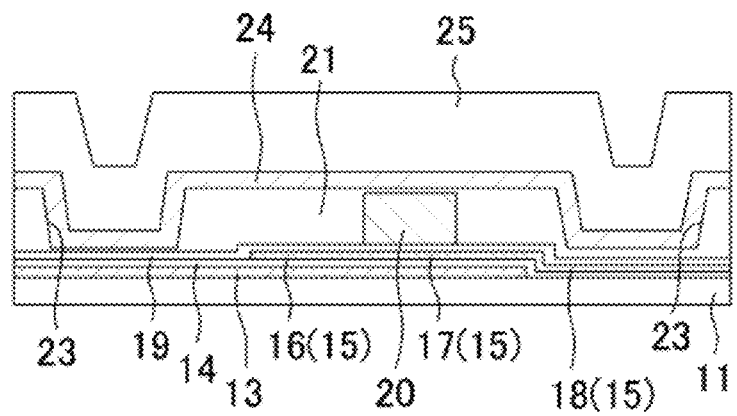
FIG. 6 is a cross-sectional view showing a second interlayer insulating film laminated on the first interlayer insulating film.

Here, FIG. 2 is a cross-sectional view showing a photoresist film 31 formed on an inorganic film 33. FIG. 3 is a cross-sectional view showing a resist mask 22 with openings 32 formed therein. FIG. 4 is a cross-sectional view showing the planarizing layer 21 with recessed portions 23 formed therein. FIG. 5 is a cross-sectional view showing the first interlayer insulating film 24 laminated on the planarizing layer 21. FIG. 6 is a cross-sectional view showing the second interlayer insulating film 25 laminated on the first interlayer insulating film 24.

First, as shown in FIG. 2, the lower layer gate electrode 13 (first conductive film) made of an Mo film is formed on the glass substrate 11 by sputtering or the like in the thickness of about 100 nm. Next, by forming an SiO$_2$ film having a thickness of about 100 nm so as to cover the lower layer gate electrode 13, the bottom gate insulating film 14 is formed. In addition, it is preferable to form a base coat layer made of SiNO in the thickness of about 50 nm, for example. Next, the semiconductor layer 15 made of silicon is formed in the thickness of about 50 nm. The respective thin films are patterned by photolithography.

Next, the gate insulating film 19 made of SiO$_2$ is formed in the thickness of about 80 nm. After that, by laminating TaN of about 50 nm and W of about 400 nm thickness on the surface of the gate insulating film 19, the gate electrode 20 (first wiring layer) that is thicker than the lower layer gate electrode 13 and the semiconductor layer 15 is formed. Then, by doping an impurity element, such as boron, for example, to the semiconductor layer 15 using the gate electrode 20 as a mask, the source region 16, the channel region 17, and the drain region 18 (second conductive film) are formed.

Next, on the glass substrate 11, the inorganic film 33 made of SiO$_2$, for example, is formed in the thickness of about 300 nm to 500 nm so as to cover the gate electrode 20, the lower layer gate electrode 13, the drain region 18, and the like. The surface of the inorganic film 33 is formed in a convex shape, reflecting the outer shape of the gate electrode 20 that is greatly protruding from the surrounding areas thereof. After that, the photoresist film 31 as a planarizing member is formed on the surface of the inorganic film 33. Here, in order to planarize the surface of the photoresist film 31, the thickness of the photoresist film 31 is set to about 1.5 μm.

Next, as shown in FIG. 3, the photoresist film 31 is exposed and developed to form the resist mask 22 that has openings in regions in which the lower layer gate electrode 13 and the drain region 18 are respectively formed. That is, the openings 32 are formed to penetrate through the resist mask 22.

Next, as shown in FIG. 4, dry-etching is performed to etch back the resist mask 22 and the inorganic film 33 simultaneously. The recessed portions 23 are thereby formed on the surface of the inorganic film 33 in regions that have been exposed by the openings 32 of the resist mask 22, while the planarizing layer 21 is formed from the inorganic film 33 by planarizing the surface of the inorganic film 33 in regions that have been covered by the resist mask 22.

Here, the recessed portions 23 may be formed to penetrate through the inorganic film 33 and the gate insulating film 19.

A gas that can provide a sufficient selection ratio to a silicon film of the semiconductor layer 15 ($C_4F_8+H_2$, $C_2F_6+H_2$, $C_5F_8+H_2$, $CHF_3$, or the like, for example) is employed as the gas used for the etch back.

Next, as shown in FIG. 5, the first interlayer insulating film 24 made of a silicon nitride film (SiNx) is laminated on the surface of the planarizing layer 21 in the thickness of about 50 nm to 250 nm, for example. The inner surfaces of the recessed portions 23 are thereby covered by the first interlayer insulating film 24.

Next, as shown in FIG. 6, on the glass substrate 11, the second interlayer insulating film 25 made of an inorganic film of SiO$_2$ or the like is formed so as to cover the planarizing layer 21. The second interlayer insulating film 25 is formed in the thickness of about 700 nm. Here, the surface of the second interlayer insulating film 25 is formed so as to have recesses in a concave shape in the regions in which the recessed portions 23 are formed.

Thereafter, as shown in FIG. 1, the first contact hole 29 is formed on the gate electrode 20, and also, the second contact holes 26 that have smaller inner diameter than that of the recessed portions 23 are formed on the lower layer gate electrode 13 and on the drain region 18, respectively. The first contact hole 29 is formed by etching so as to penetrate through the second interlayer insulating film 25, the first interlayer insulating film 24, and the planarizing layer 21 on the gate electrode 20 and to reach the gate electrode 20, thereby exposing the gate electrode 20.

On the other hand, the second contact hole 26 on the lower layer gate electrode 13 is formed by etching so as to penetrate through the second interlayer insulating film 25, the first interlayer insulating film 24, the planarizing layer 21, the gate insulating film 19, and the bottom gate insulating film 14 and to reach the lower layer gate electrode 13, to run through the inside of the recessed portion 23, and to expose the lower layer gate electrode 13.

Also, the second contact hole 26 on the drain region 18 is formed by etching so as to penetrate through the second interlayer insulating film 25, the first interlayer insulating film 24, the planarizing layer 21, and the gate insulating film 19, to run through inside of the recessed portion 23, and to expose the drain region 18.

Here, because the surface of the second interlayer insulating film 25 has recesses above the recessed portions 23, the second contact holes 26 can be formed with a contact hole depth that has been reduced (that is, the aspect ratio being reduced) by the depth of the recesses.

Next, by disposing a metal material layer including aluminum on the second interlayer insulating film 25, and by patterning that layer by photolithography and etching, the lower layer gate wiring line 28 electrically connected to the lower layer gate electrode 13 through the second contact hole 26, the drain wiring line 27 electrically connected to the drain region 18 through the second contact hole 26, and the upper layer gate wiring line 30 electrically connected to the gate electrode 20 through the first contact hole 29 are formed on the second interlayer insulating film 25. In this manner, the semiconductor device 1 is manufactured.

Effects of Embodiment 1

According to this Embodiment 1, because the planarizing layer 21 covering the gate electrode 20, the lower layer gate electrode 13, and the drain region 18 is made of an SiO$_2$ film, which is an inorganic film, the semiconductor device 1 can be manufactured by a relatively high-temperature manufacturing process.

Further, because the planarizing layer 21 has the recessed portions 23 formed in the regions in which the lower layer gate electrode 13 and the drain region 18 are respectively disposed, and because the second contact holes 26 having smaller inner diameter than that of the recessed portions 23 are formed so as to run through the inside of the recessed portions 23, the aspect ratio can be reduced when the second contact holes 26 are formed.

That is, because the surface of the second interlayer insulating film 25 can be formed so as to have recesses above the recessed portions 23, the second contact holes 26 can be formed with a contact hole depth that has been reduced (that is, with the aspect ratio being reduced) by the depth of the recess. As a result, damage to the gate electrode 20, the lower layer gate electrode 13, and the drain region 18 can be suppressed.

Furthermore, over-etching can be suppressed by reducing the etching time, and therefore, the second contact holes can be suitably miniaturized. As a result, the first contact hole 29 and the second contact hole 26 can be placed close to each other, while maintaining the insulating properties. Thus, the entire wiring structure can be miniaturized.

Further, because the first interlayer insulating film 24 made of an SiNx film is laminated on the planarizing layer 21, if the semiconductor layer 15 is exposed inside of the first contact hole 29 when the first contact hole 29 was formed, the semiconductor layer 15 can be hydrogenated (defect repair).

Working Example

Figure 7:
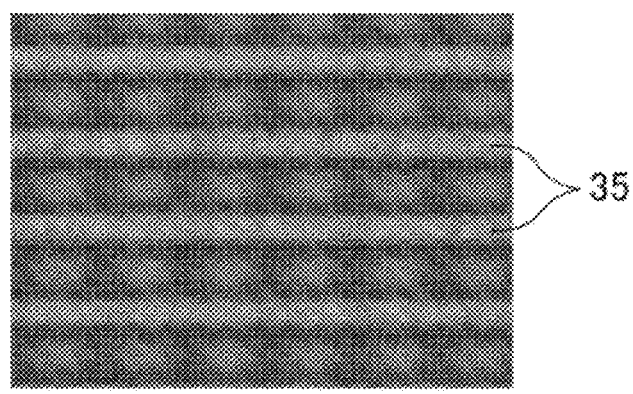
FIG. 7 is a photo showing source wiring lines that have been actually formed as a working example.
Figure 8:
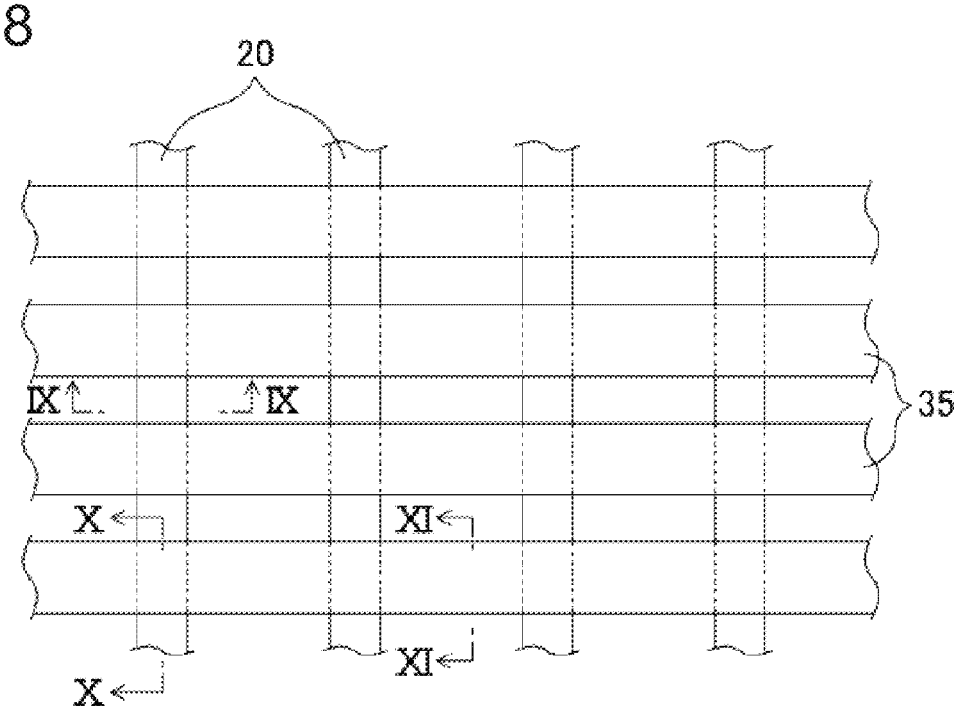
FIG. 8 is a plan view showing a structure of source wiring lines and gate electrodes.

Here, FIG. 7 is a photo showing source wiring lines 35 that have been actually manufactured in a manner described above as a working example. FIG. 8 is a plan view showing a structure of the source wiring lines 35 and the gate electrodes 20. Also, FIGS. 9 to 11 are, respectively, a cross-sectional view along the line IX-IX, a cross-sectional view along the line X-X, and a cross-sectional view along the line XI-XI in FIG. 8.

Figure 12:
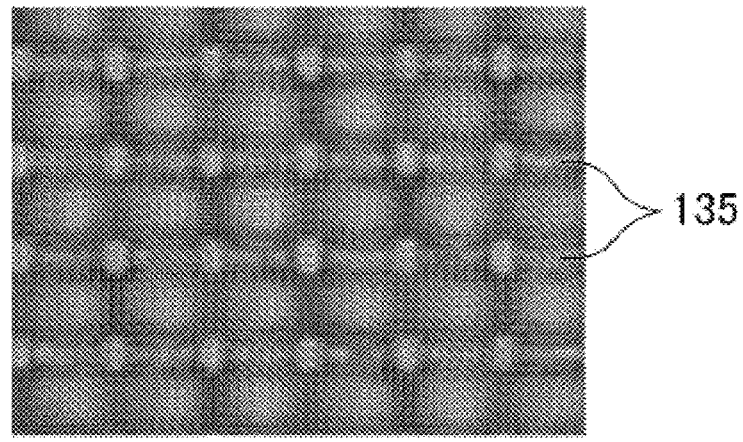
FIG. 12 is a photo showing source wiring lines that have been formed without planarization as a comparison example.
Figure 13:
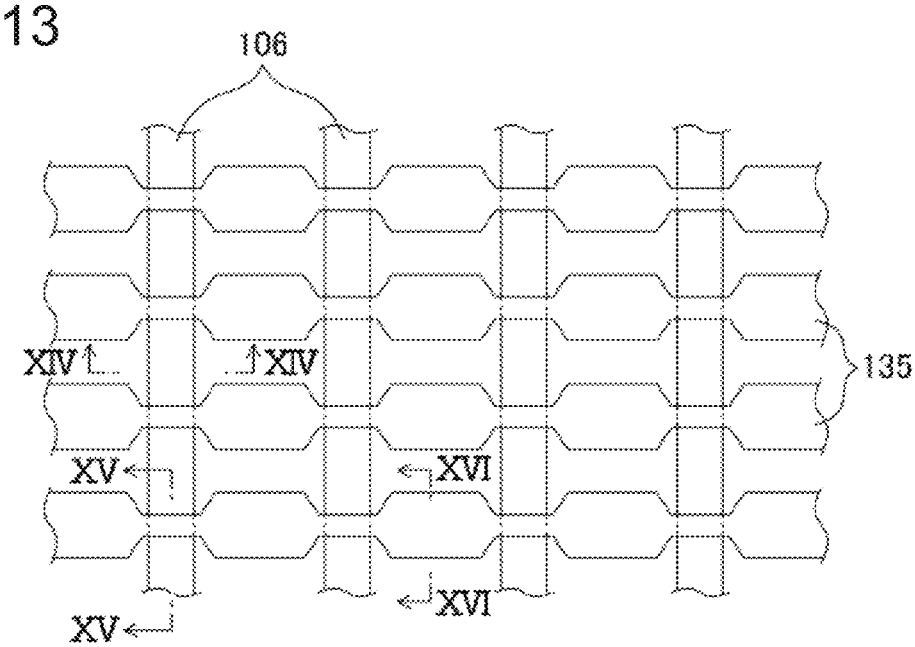
FIG. 13 is a plan view showing a structure of source wiring lines and gate electrodes.

FIG. 12 is a photo showing source wiring lines 135 that have been manufactured without planarization as a comparison example. FIG. 13 is a plan view showing a structure of the source wiring lines 135 and the gate electrodes 106. Also, FIGS. 14 to 16 are, respectively, a cross-sectional view along the line XIV-XIV, a cross-sectional view along the line XV-XV, and a cross-sectional view along the line XVI-XVI in FIG. 13.

In contrast to the comparison example in which the pattern of the source wiring lines 135 was formed in uneven width as shown in FIGS. 12 and 13, it was found that, in Embodiment 1, the width of the source wiring lines 35 can be formed accurately and uniformly as in the working example shown in FIGS. 7 and 8.

Figure 9:
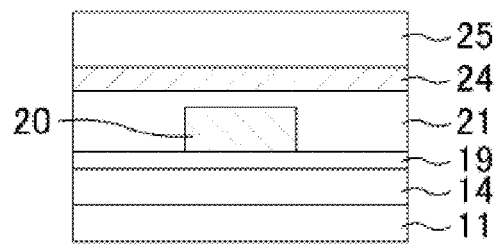
FIG. 9 is a cross-sectional view along the line IX-IX in FIG. 8.
Figure 10:
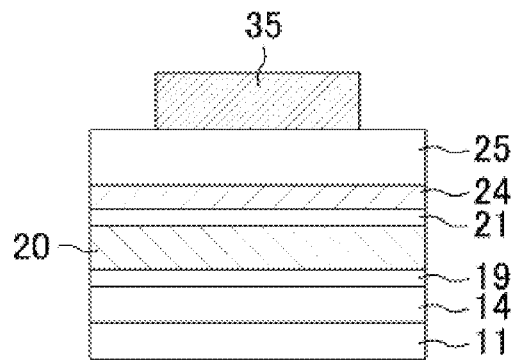
FIG. 10 is a cross-sectional view along the line X-X in FIG. 8.
Figure 11:
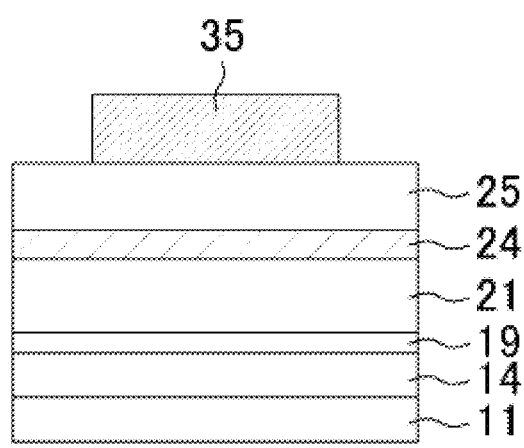
FIG. 11 is a cross-sectional view along the line XI-XI in FIG. 8.
Figure 14:
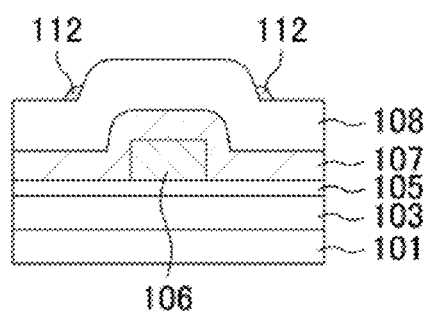
FIG. 14 is a cross-sectional view along the line XIV-XIV in FIG. 13.
Figure 15:
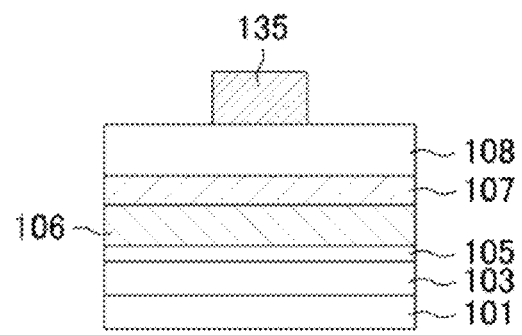
FIG. 15 is a cross-sectional view along the line XV-XV in FIG. 13.
Figure 16:
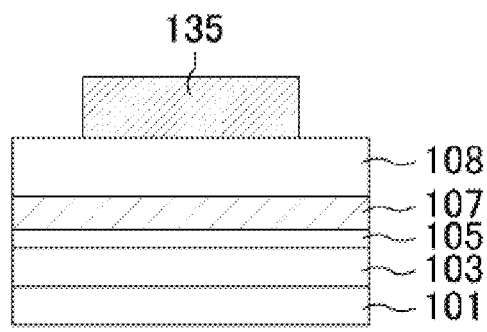
FIG. 16 is a cross-sectional view along the line XVI-XVI in FIG. 13.

Also, in contrast to the comparison example in which the surface of the second interlayer insulating film 108 is formed in a step shape, reflecting the convex shape of the gate electrode 106, and thereby creating the wiring layer residues 112 as shown in FIGS. 14 to 16, the working example of this embodiment shows that the surface of the second interlayer insulating film 25 is planarized, and the generation of residues is suppressed as shown in FIGS. 9 to 11.

Figure 17:
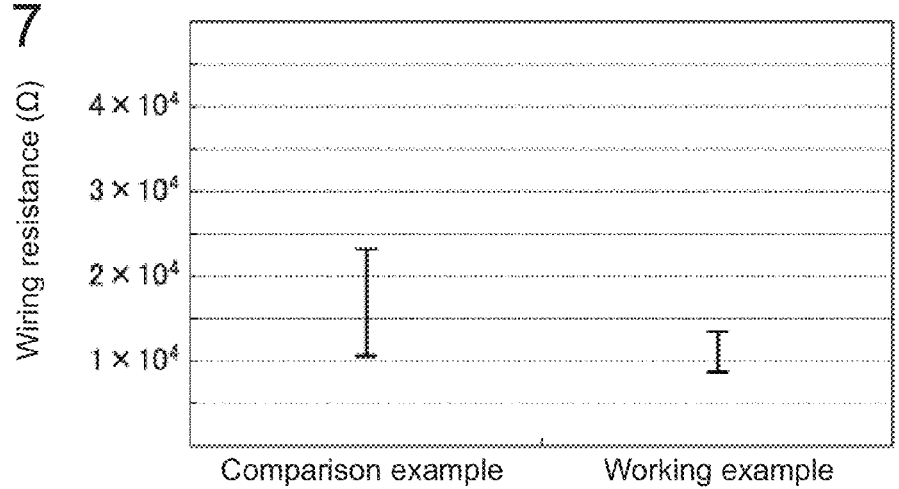
FIG. 17 is a graph showing measurement results of wiring resistance values at a plurality of positions in a comparison example without planarization and a working example with planarization.
Figure 18:
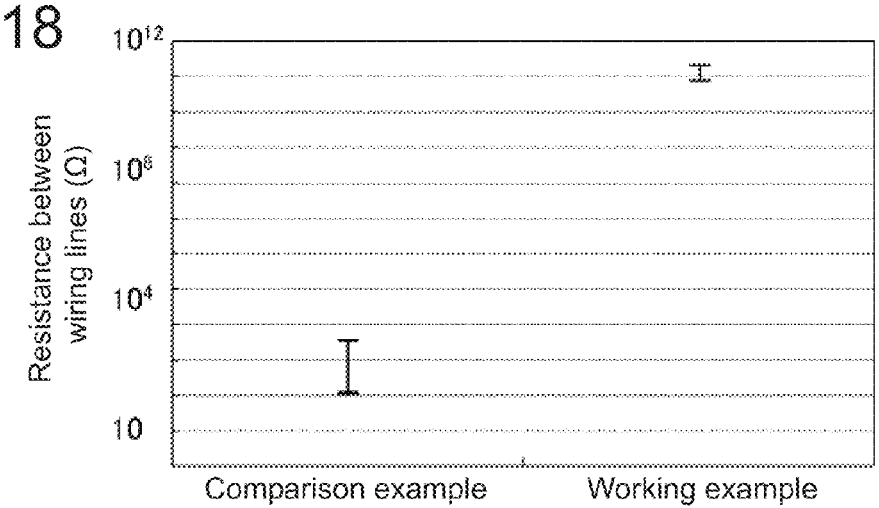
FIG. 18 is a graph showing measurement results of resistance values between wiring lines at a plurality of positions in the abovementioned comparison example and the abovementioned working example.

Next, FIG. 17 is a graph showing measurement results of the wiring resistance values at a plurality of positions in the comparison example without planarization and in the working example with planarization. FIG. 18 is a graph showing measurement results of the resistance values between wiring lines at a plurality of positions in the above-mentioned comparison example and in the above-mentioned working example.

For the measurement, gate electrodes were formed in the width of 1.5 μm, and 1.5 μm-wide source wiring lines were formed thereon with an interlayer insulating film therebetween. After that, existence or absence of a wire breakage and a leakage of the source wiring lines was studied.

As shown in FIG. 17, in the source wiring lines 135 of the comparison example, because of the major variations in the wiring line width, the wiring resistance varied greatly, resulting in reducing the form accuracy of the source wiring lines 135. On the other hand, in the working example, it was confirmed that the wiring resistance was relatively small and no wire breakage was created in all of the source wiring lines 35 of the working example that have been measured.

Also, as shown in FIG. 18, the resistance between the wiring lines is smaller in the source wiring lines 135 of the comparison example than in the source wiring lines 35 of the working example, indicating that a leakage is generated between the source wiring lines 135. In contrast, with regard to all of the measured source wiring lines 35 of the working example, it was confirmed that the resistance between the wiring lines was maintained high, and no wire breakage occurred.

Embodiment 2

FIGS. 19 to 23 show Embodiment 2 according to the present invention.

Figure 19:
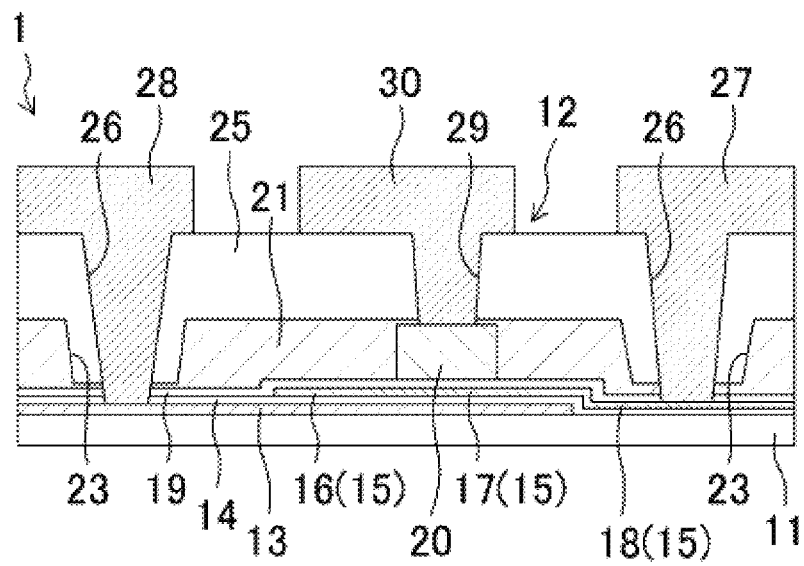
FIG. 19 is a cross-sectional diagram showing an enlarged view of a structure of a semiconductor device according to Embodiment 2.

FIG. 19 is a cross-sectional diagram showing an enlarged view of a structure of a semiconductor device 1 in Embodiment 2. FIGS. 20 to 23 are cross-sectional views showing a manufacturing process of the semiconductor device 1 of Embodiment 2. In the embodiments hereinafter, the same reference characters are given to the same parts as those of FIGS. 1 to 6, and the detailed explanations thereof will not be repeated.

(Configuration of Semiconductor Device)

While the two layers of interlayer insulating films (first interlayer insulating film 24 and second interlayer insulating film 25) were laminated on the planarizing layer 21 in Embodiment 1 above, Embodiment 2 differs from Embodiment 1 in that a single layer of the interlayer insulating film 25 is laminated on the planarizing layer 21 made of an SiNx film, which is an inorganic film.

Similar to Embodiment 1 above, the planarizing layer 21 has the recessed portions 23 formed therein as shown in FIG. 19. Further, on the surface of the planarizing layer 21, an interlayer insulating film (corresponding to the second interlayer insulating film 25 of Embodiment 1 above) 25 made of an SiO₂ film is laminated.

Here, the planarizing layer 21 is formed in the thickness of 300 nm to 500 nm, and the interlayer insulating film 25 is formed in the thickness of about 700 nm.

On the gate electrode 20, the first contact hole 29 penetrating through the interlayer insulating film 25 is formed. On the lower layer gate electrode 13 and on the drain region 18, on the other hand, the second contact holes 26 penetrating through the interlayer insulating film 25, the planarizing layer 21, and the like are formed so as to run through the inside of the recessed portions 23.

Also, the interlayer insulating film 25 has the drain wiring line 27 electrically connected to the drain region 18 through the second contact hole 26, the lower layer gate wiring line 28 electrically connected to the lower layer gate electrode 13 through the second contact hole 26, and the upper layer gate wiring line 30 electrically connected to the gate electrode 20 through the first contact hole 29 formed thereon.

—Manufacturing Method—

Next, a method of manufacturing the above-mentioned semiconductor device 1 will be explained with reference to FIGS. 20 to 23.

Figure 20:
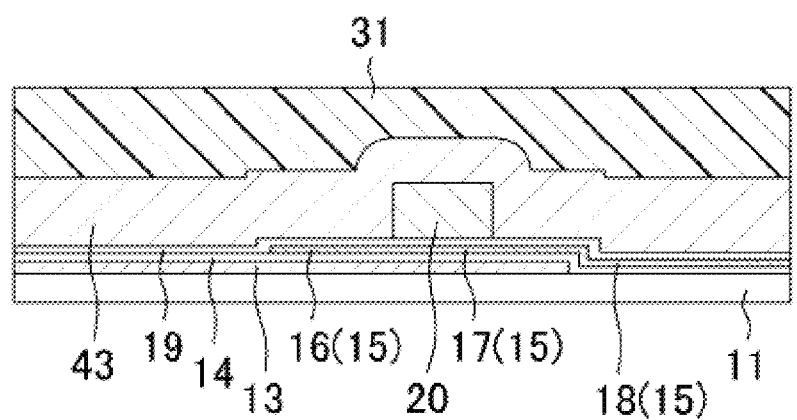
FIG. 20 is a cross-sectional view showing a photoresist film formed on an inorganic film.
Figure 21:
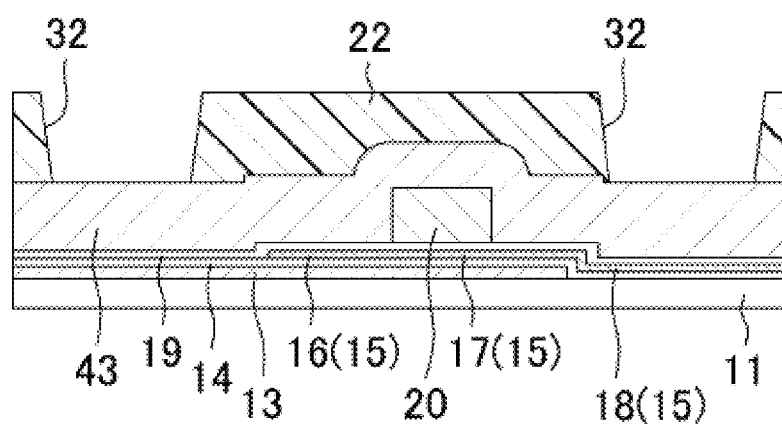
FIG. 21 is a cross-sectional view showing a resist mask with openings formed therein.
Figure 22:
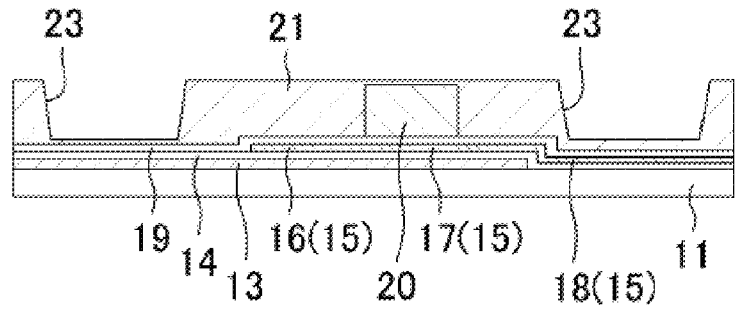
FIG. 22 is a cross-sectional view showing a planarizing layer with recessed portions formed therein.
Figure 23:
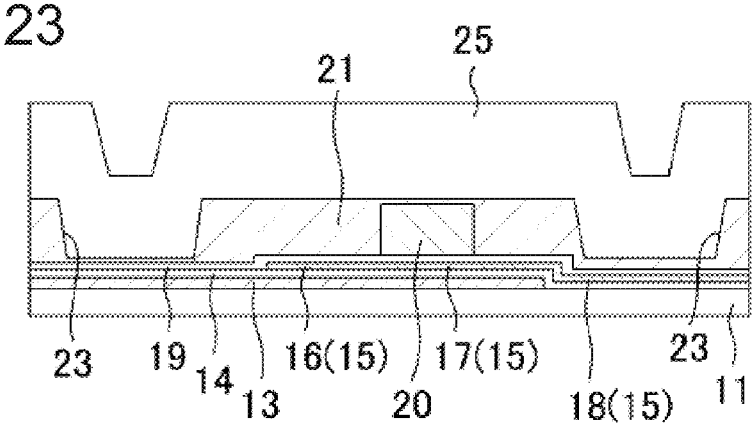
FIG. 23 is a cross-sectional view showing an interlayer insulating film laminated on the planarizing layer.
Figure 24:
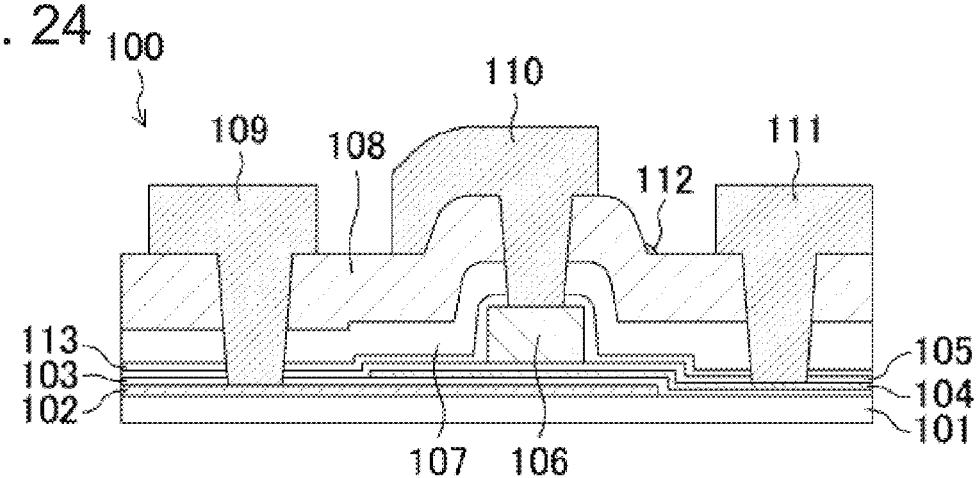
FIG. 24 is a cross-sectional diagram showing an enlarged view of a part of a conventional TFT substrate.
Figure 25:
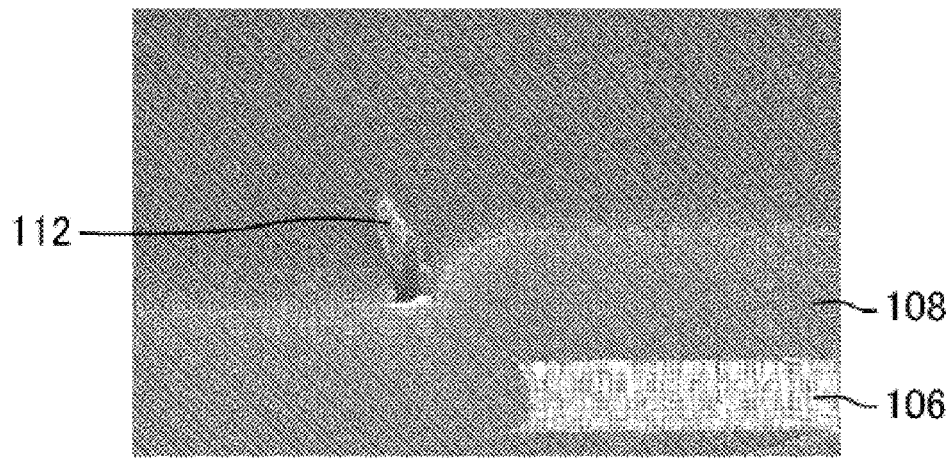
FIG. 25 is a photo showing an enlarged view of residues formed on a conventional second interlayer insulating film.
Figure 26:
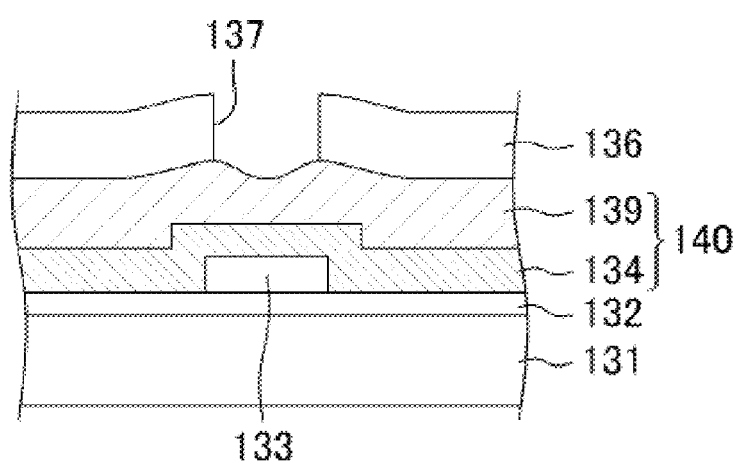
FIG. 26 is a cross-sectional view showing a lamination structure in which a conventional photoresist film is formed.
Figure 27:
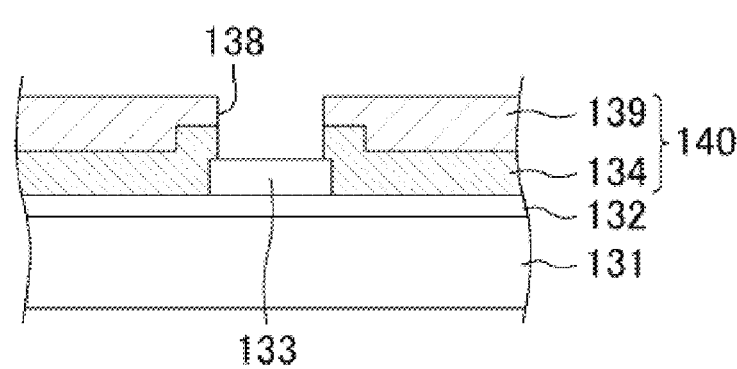
FIG. 27 is a cross-sectional view showing a lamination structure in which a conventional contact hole is formed.

FIG. 20 is a cross-sectional view showing a photoresist film 31 formed on an inorganic film 43. FIG. 21 is a cross-sectional view showing a resist mask 22 with openings 32 formed therein. FIG. 22 is a cross-sectional view showing the planarizing layer 21 with recessed portions 23 formed therein. FIG. 23 is a cross-sectional view showing the interlayer insulating film 25 laminated on the planarizing layer 21.

In Embodiment 2, as shown in FIG. 20, an inorganic film 43 made of SiNx is formed on the glass substrate 11 in the thickness of about 300 nm to 500 nm so as to cover the gate electrode 20, the lower layer gate electrode 13, the drain region 18, and the like. Then, on the surface of the inorganic film 43, the photoresist film 31 as a planarizing material is formed in the thickness of about 1.5 μm.

Next, as shown in FIG. 21, the photoresist film 31 is exposed and developed to form the resist mask 22 having openings 32 formed therethrough.

Next, as shown in FIG. 22, dry-etching is performed to etch back the resist mask 22 and the inorganic film 43 simultaneously. The recessed portions 23 are thereby formed on the surface of the inorganic film 43 in regions that have been exposed by the openings 32 of the resist mask 22, while the planarizing layer 21 is formed from the inorganic film 43 by planarizing the surface of the inorganic film 43 in regions that have been covered by the resist mask 22.

Next, as shown in FIG. 23, on the surface of the planarizing layer 21, the interlayer insulating film 25 made of an $SiO_2$ film is formed in the thickness of about 700 nm. Here, the surface of the interlayer insulating film 25 is formed so as to have recesses in a concave shape in the regions in which the recessed portions 23 are formed.

Thereafter, as shown in FIG. 19, the first contact hole 29 and the second contact holes 26 are formed in the interlayer insulating film 25 and the planarizing layer 21 by etching. The second contact holes 26 are formed so as to run through the inside of the recessed portions 23.

At this time, similar to Embodiment 1 above, because the surface of the interlayer insulating film 25 has recesses above the recessed portions 23, the second contact holes 26 can be formed with a contact hole depth that has been reduced (that is, the aspect ratio being reduced) by the depth of the recess.

Next, on the interlayer insulating film 25, the lower layer gate wiring line 28, the drain wiring line 27, and the upper layer gate wiring line 30 are formed. In this manner, the semiconductor device 1 is manufactured.

Effects of Embodiment 2

In Embodiment 2, the effects similar to those of Embodiment 1 above can also be obtained without structural problems. However, the refractive index of an SiNx film is about 2.0, and because it is higher than that of an $SiO_2$ film, which is about 1.45, interference fringes may be generated at places depending on variations in the film thickness of the planarizing layer 21. Thus, the configuration according to Embodiment 2 is suitable for a reflective type, other than a transmissive type, liquid crystal display device, or a self-emitting type organic EL display device.

Further, because there is no first interlayer insulating film 24 and the number of film formation steps is reduced by one as compared with Embodiment 1 above, the manufacturing cost can be reduced.

Other Embodiments

In Embodiments 1 and 2 above, the semiconductor device 1 used for a liquid crystal display device has been explained. The present invention may be configured as a semiconductor device used for an organic EL display device and the like, for example.

Also, as described above, Embodiment 1 above has explained an example of the first contact hole 29 penetrating through the first interlayer insulating film 24 and the second interlayer insulating film 25, and the second contact hole 26 penetrating through the first interlayer insulating film 24, the second interlayer insulating film 25, the planarizing layer 21, and the gate insulating film 19. But the present invention is not limited to such, and the first contact hole 29 and the second contact hole 26 may be formed to penetrate through at least the second interlayer insulating film 25.

Also, in each of the embodiments above, examples of forming the drain wiring line 27, the lower layer gate wiring line 28, and the upper layer gate wiring line 30 on the surface of the second interlayer insulating film 25 have been explained. But the present invention is not limited to such, and the respective wiring lines 27, 28, and 30 may be formed in different layers on the second interlayer insulating film 25.

Also, in each of the embodiments above, examples of the first wiring layer being the gate electrode 20 of an MOS transistor have been explained. But the present invention is not limited to such, and the first wiring layer may be an electrode that constitutes a photodiode used for an optical sensor or the like, for example.

INDUSTRIAL APPLICABILITY

As described above, the present invention is useful for a semiconductor device used in a liquid crystal display device and the like, for example, and for a manufacturing method thereof.

DESCRIPTION OF REFERENCE CHARACTERS 1. semiconductor device
11 glass substrate (insulating substrate)
12 MOS transistor
13 lower layer gate electrode (conductive film)
15 semiconductor layer
18 drain region (conductive film)
20 gate electrode (first wiring layer)
21 planarizing layer
22 resist mask
23 recessed portion
24 first interlayer insulating film (silicon nitride film)
25 second interlayer insulating film
26 second contact hole
27 drain wiring line (second wiring layer)
28 lower layer gate wiring line (second wiring layer)
29 first contact hole
30 upper layer gate wiring line (third wiring layer)
31 photoresist film
32 opening
33, 43 inorganic films

The invention claimed is:

1. A method of manufacturing a semiconductor device, comprising:
   forming a conductive film and a first wiring layer that is thicker than said conductive film on an insulating substrate;
   forming an inorganic film covering the first wiring layer and the conductive film over the insulating substrate;
   forming a photoresist film on a surface of the inorganic film;
   exposing the photoresist film to form a resist mask having an opening in a region in which the conductive film is formed;
   etching the resist mask and the inorganic film simultaneously to form a recessed portion in a surface of the inorganic film in a region that has been exposed by the opening, and to form a planarizing layer from the inorganic film by planarizing the surface of the inorganic film in a region that has been covered by the resist mask;
   forming an interlayer insulating film over the insulating substrate so as to cover the planarizing layer;
   forming, on the first wiring layer, a first contact hole penetrating through at least the interlayer insulating film and reaching said first wiring layer;

forming, on the conductive film, a second contact hole penetrating through at least the interlayer insulating film and reaching said conductive film so as to run through an inside of the recessed portion; and on the interlayer insulating film, a second wiring layer electrically connected to the conductive film through the second contact hole, and a third wiring layer electrically connected to the first wiring layer through the first contact hole.

2. The method of manufacturing a semiconductor device according to claim 1, wherein the conductive film is a semiconductor layer with an impurity element introduced therein.

3. The method of manufacturing a semiconductor device according to claim 1, wherein an SiNx film is laminated on the surface of the planarizing layer in the step of forming the interlayer insulating film.

4. The method of manufacturing a semiconductor device according to claim 1, wherein the planarizing layer is made of $SiO_2$.

5. The method of manufacturing a semiconductor device according to claim 1, wherein the planarizing layer is made of SiNx.

6. The method of manufacturing a semiconductor device according to claim 1, wherein the first wiring layer is a gate electrode of an MOS transistor.

* * * * *